(12) United States Patent
Chirania

(10) Patent No.: US 7,471,104 B1
(45) Date of Patent: Dec. 30, 2008

(54) LOOKUP TABLE WITH RELATIVELY BALANCED DELAYS

(75) Inventor: Manoj Chirania, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/059,021

(22) Filed: Mar. 31, 2008

Related U.S. Application Data

(63) Continuation-in-part of application No. 11/881,504, filed on Jul. 27, 2007, now Pat. No. 7,423,452.

(51) Int. Cl.
*H03K 19/173* (2006.01)
(52) U.S. Cl. .......................................... 326/38; 326/41
(58) Field of Classification Search .............. 326/37–41
See application file for complete search history.

(56) References Cited

U.S. PATENT DOCUMENTS

| | | | |
|---|---|---|---|
| 5,646,545 | A | 7/1997 | Trimberger et al. |
| 5,926,036 | A | 7/1999 | Cliff et al. |
| 6,400,180 | B2 | 6/2002 | Wittig et al. |
| 6,621,298 | B2 | 9/2003 | Agrawal et al. |
| 6,667,635 | B1 | 12/2003 | Pi et al. |
| 6,768,335 | B1 | 7/2004 | Young et al. |
| 6,768,338 | B1 | 7/2004 | Young et al. |
| 6,949,951 | B1 | 9/2005 | Young et al. |
| 6,998,872 | B1 | 2/2006 | Chirania et al. |
| 7,053,654 | B1 | 5/2006 | Young et al. |
| 7,061,271 | B1 | 6/2006 | Young et al. |
| 7,378,869 | B1 * | 5/2008 | Chirania et al. ............... 326/38 |
| 7,385,416 | B1 * | 6/2008 | Chirania et al. ............... 326/38 |

OTHER PUBLICATIONS

Xilinx, Inc.; U.S. Appl. No. 11/725,742, filed by Kao et al. on Mar. 20, 2007.
Xilinx, Inc.; U.S. Appl. No. 11/881,504, filed by Chirania on Jul. 27, 2007.
Xilinx, Inc.; "The Programmable Logic Data Book 1994"; published 1994; available from Xilinx, Inc., 2100 Logic Drive, San Jose, California 95124; pp. 2-110 thru 2-111.
Altera Corporation; "Stratix II Device Family Data Sheet"; v1.0; published Feb. 2004; available from Altera Corporation; 101 Innovation Drive, San Jose, California 95134; pp. 2-1 thru 2-22.
Krueger, Ralf et al.; WP209 (v1.0); "Virtex Variable-Input LUT Architecture"; Jan. 12, 2004; available from Xilinx, Inc.; 2100 Logic Drive, San Jose, California 95124; pp. 1-6.
Cataldo, Anthony et al.; "FPGA Vendors Revise Logic for Sub-100-nm Era"; EE Times; Feb. 2, 2004; downloaded from http://www.eetimes.com/story/OEG20040202S0019; pp. 1-4.

* cited by examiner

*Primary Examiner*—Don P Le
(74) *Attorney, Agent, or Firm*—Lois D. Cartier

(57) ABSTRACT

Lookup table circuits (LUTS) having multiple stages differently optimized to balance delays through the lookup table. A first multiplexing stage is optimized for a fast path from the control input to the data outputs, while a second and subsequent stage multiplexers are optimized for a fast path from data inputs to data outputs. In some embodiments, additional delay is introduced into the control inputs of the later stages, e.g., the LUT input paths with the smallest through-delays, in order to further balance the through-delays for the lookup table.

20 Claims, 7 Drawing Sheets

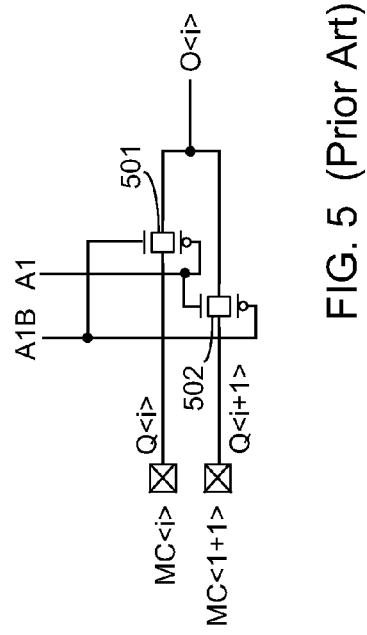
FIG. 5 (Prior Art)
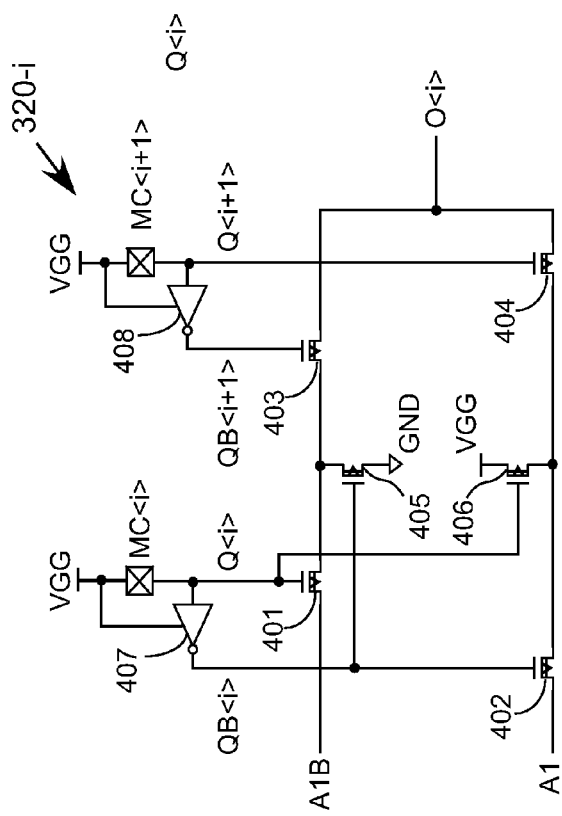
FIG. 4
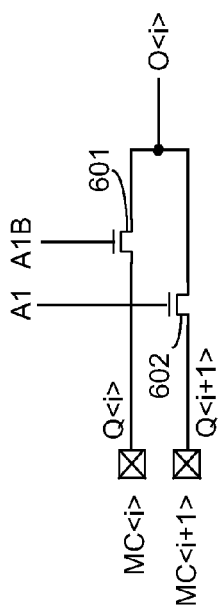
FIG. 6 (Prior Art)
| Q<i> | Q<i+1> | O<i> |
|---|---|---|
| | | A1B |
| 1 | 0 | A1 |
| 0 | 1 | 0 |
| 0 | 0 | |
| 1 | 1 | 1 |
FIG. 7

LOOKUP TABLE WITH RELATIVELY BALANCED DELAYS

CROSS-REFERENCE TO RELATED APPLICATIONS

This application is a continuation-in-part of co-pending, commonly assigned application Ser. No. 11/881,504, by Manoj Chirania, entitled "An Integrated Circuit Including a Multiplexer Circuit" and filed Jul. 27, 2007, which is incorporated herein by reference.

FIELD OF THE INVENTION

The invention relates to integrated circuit devices (ICs). More particularly, the invention relates to a lookup table circuit in an IC.

BACKGROUND

Programmable logic devices (PLDs) are a well-known type of programmable integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, lookup tables, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

A lookup table (LUT) is a selection circuit that accepts any number of inputs up to a specified maximum number, and provides any function of the input values. A lookup table is typically implemented as a random access memory, with the inputs being used to address the memory. Thus, for an n-input lookup table, 2**n (two to the nth power) possible outputs are provided, providing one output value for each possible combination of n input values.

FIG. 1 illustrates a typical implementation for a 4-input LUT. The LUT of FIG. 1 is implemented as a 16-input multiplexer, with the 16 data inputs being 16 possible output values for the LUT, stored in memory cells MC<0:15>. For example, for a LUT in a programmable IC such as an FPGA, the memory cells can be configuration memory cells. The four control inputs for the multiplexer are the four input signals A1-A4 to the LUT. Thus, the LUT output signal OUT corresponds to one of the values stored in the 16 memory cells MC<0:15>, with the selection being controlled by the four LUT input signals A1-A4. Thus, the LUT can implement any function of up to four input signals. Note that while 4-input LUTs are common, LUTs having more or fewer input signals can also be implemented in a similar fashion that will accommodate larger or smaller logic functions. Note further that in the present specification, the same reference characters are used to refer to terminals, signal lines, and their corresponding signals.

As shown in FIG. 1, a typical 4-input LUT includes four stages, with the first stage being controlled by input signal A1, the second stage being controlled by input signal A2, and so forth. Inverted versions A1B-A4B of signals A1-A4 are generated by inverters 101-104, respectively. Each of sixteen configuration memory cells MC<0:15> drives a corresponding CMOS pass gate 130-145. In the first stage of the multiplexer, paired pass gates 130-131 form a 2-to-1 multiplexer controlled by signals A1 and A1B, which multiplexer drives a CMOS pass gate 146. Pass gates 132-145 are also paired in a similar fashion to form similar 2-to-1 multiplexers driving associated pass gates 147-153.

In the second stage of the multiplexer, paired pass gates 146-147 form a 2-to-1 multiplexer controlled by signals A2 and A2B, which multiplexer drives an inverter 105. Similarly, pass gates 148-153 are paired to form similar 2-to-1 multiplexers driving associated inverters 106-108. In the third stage of the multiplexer, driven by inverters 105-108, pass gates 154-155 are paired to form a 2-to-1 multiplexer controlled by signals A3 and A3B and driving a CMOS pass gate 158. Similarly, pass gates 156-157 are paired to form a similar 2-to-1 multiplexer driving a CMOS pass gate 159. In the fourth stage of the multiplexer, pass gates 158-159 are paired to form a 2-to-1 multiplexer controlled by signals A4 and A4B and driving an inverter 109. Inverter 109 provides the LUT output signal OUT.

FIG. 2 illustrates another known 4-input LUT. The LUT of FIG. 2 is similar to that of FIG. 1, except that N-channel transistors 230-259 are substituted for CMOS pass gates 130-159. Because an N-channel transistor imposes a voltage drop on power high signals traversing the transistor, the node driving each inverter 105-109 is also enhanced by the addition of a pullup (e.g., a P-channel transistor) 260-264 to power high VDD. Each pullup 260-264 is gated by the output of the corresponding inverter 105-109. The pullup ensures that a high value on the node driving the inverter is pulled all the way to the power high value once a low value appears on the inverter output node.

The known LUT designs of FIGS. 1 and 2 both function well for smaller LUTs such as 4-input LUTs. However, when the same techniques are applied to larger LUTs, some limitations become apparent. For example, the delays on the various input paths are not the same. Referring to FIGS. 1 and 2, for example, with stable values stored in memory cells MC<0:15>, a change to the A1 input signal will take longer to propagate to the output terminal OUT than a change to the A4 input signal. Thus, if all of the input signals change values simultaneously, for example, the delay from the A1 signal determines the overall through-delay for the LUT.

One solution to this difficulty is to write the design implementation software (e.g., the place-and-route software for a programmable IC) such that later-arriving input signals are placed on the faster inputs, e.g., A4 and A3 in the LUTs of FIGS. 1 and 2. However, such refinements increase the complexity and run-time of the implementation software, as well as hindering the flexibility of pin assignments for the LUTs.

Therefore, it is desirable to provide other means by which the through-delays for LUT input pins may be more balanced.

SUMMARY

The invention provides lookup table circuits having multiple stages differently optimized to balance delays through the lookup table. A first multiplexing stage is optimized for a fast path from the LUT input to the data outputs, while a second and subsequent stage multiplexers are optimized for a fast path from data inputs to data outputs. In some embodiments, additional delay is introduced into the control inputs of the later stages, e.g., the LUT input paths with the smallest through-delays, in order to further balance the through-delays for the lookup table.

According to a first embodiment, a lookup table in an integrated circuit includes a first stage and a multiplexer circuit. The first stage includes a first plurality of memory cells and a second plurality of outputs, wherein the second plurality is less than the first plurality. The first stage is coupled to receive a first LUT input. Each of the outputs of the first stage is associated with at least one of the memory cells, and, for each output, a delay from the first LUT input to the output is less than a delay from the at least one associated memory cell to the output. The multiplexer circuit includes a plurality of data inputs coupled to the outputs of the first stage, a data output coupled to an output terminal of the LUT, and first and second control inputs coupled to receive second and third LUT inputs, respectively.

In some embodiments, a delay element is coupled between second and third LUT input terminals respectively coupled to provide second and third LUT inputs and the first and second control inputs of the multiplexer circuit. The delay element increases delays between the second and third LUT inputs and the data output of the multiplexer circuit. In some embodiments, the delay element is a decoder, which enables reduced delays between the data inputs of the multiplexer circuit and the data output of the multiplexer circuit, compared to a similar circuit without the decoder, by allowing multiple transmission gates in the multiplexer circuit to be replaced with a single transmission gate on the data through-path.

In some embodiments, the first stage is designed using faster transistors than corresponding transistors in the multiplexer circuit. For example, the N-channel transistors in the first stage can be faster than the N-channel transistors in the multiplexer circuit, and the P-channel transistors in the first stage can be faster than the P-channel transistors in the multiplexer circuit. This can be accomplished, for example, by using larger transistors for the first stage, operating the first stage at a higher voltage while using a thicker oxide for the first-stage transistors, and/or using transistors having lower threshold voltages for the first stage.

In some embodiments, an additional stage is added between the first stage and the multiplexer circuit. The second stage is a multiplexer circuit having a control input coupled to receive the second LUT input. In the first stage, for each output, a delay from the first LUT input to the output is less than a delay from the at least one associated memory cell to the output. In the additional second stage, for each output, a delay from each data input to the output is less than a delay from the second LUT input to the output. Subsequent stages are implemented as a multiplexer circuit, which may have one or more delay elements introduced on the control inputs, as described above, to further balance the through-delays.

The invention also provides integrated circuits including lookup tables such as those described above.

BRIEF DESCRIPTION OF THE DRAWINGS

The present invention is illustrated by way of example, and not by way of limitation, in the following figures.

FIG. 4 shows a multiplexing circuit that can be used in the first stage of the LUT structure of FIG. 3, for example.

FIG. 5 shows a first known 2-input multiplexer structure.

FIG. 6 shows a second known 2-input multiplexer structure.

FIG. 7 shows a truth table that applies to each of the structures of FIGS. 4-6.

DETAILED DESCRIPTION OF THE DRAWINGS

The present invention is applicable to a variety of integrated circuits (ICs). The present invention has been found to be particularly applicable and beneficial for programmable integrated circuits such as programmable logic devices (PLDs), including field programmable logic devices (FPGAs). More specifically, the present invention is particularly beneficial for implementing lookup tables (LUTs) in programmable ICs. Therefore, an appreciation of the present invention is presented by way of specific examples implementing LUTs. However, the invention can also be applied to ICs other than programmable ICs and PLDs. Therefore, the present invention is not limited by these examples.

In the following examples, well known features have not been described in detail, so as not to obscure the invention. For ease of illustration, the same numerical labels are used in different diagrams to refer to the same elements of the figures. However, in alternative embodiments the elements may be different.

Figure 2:
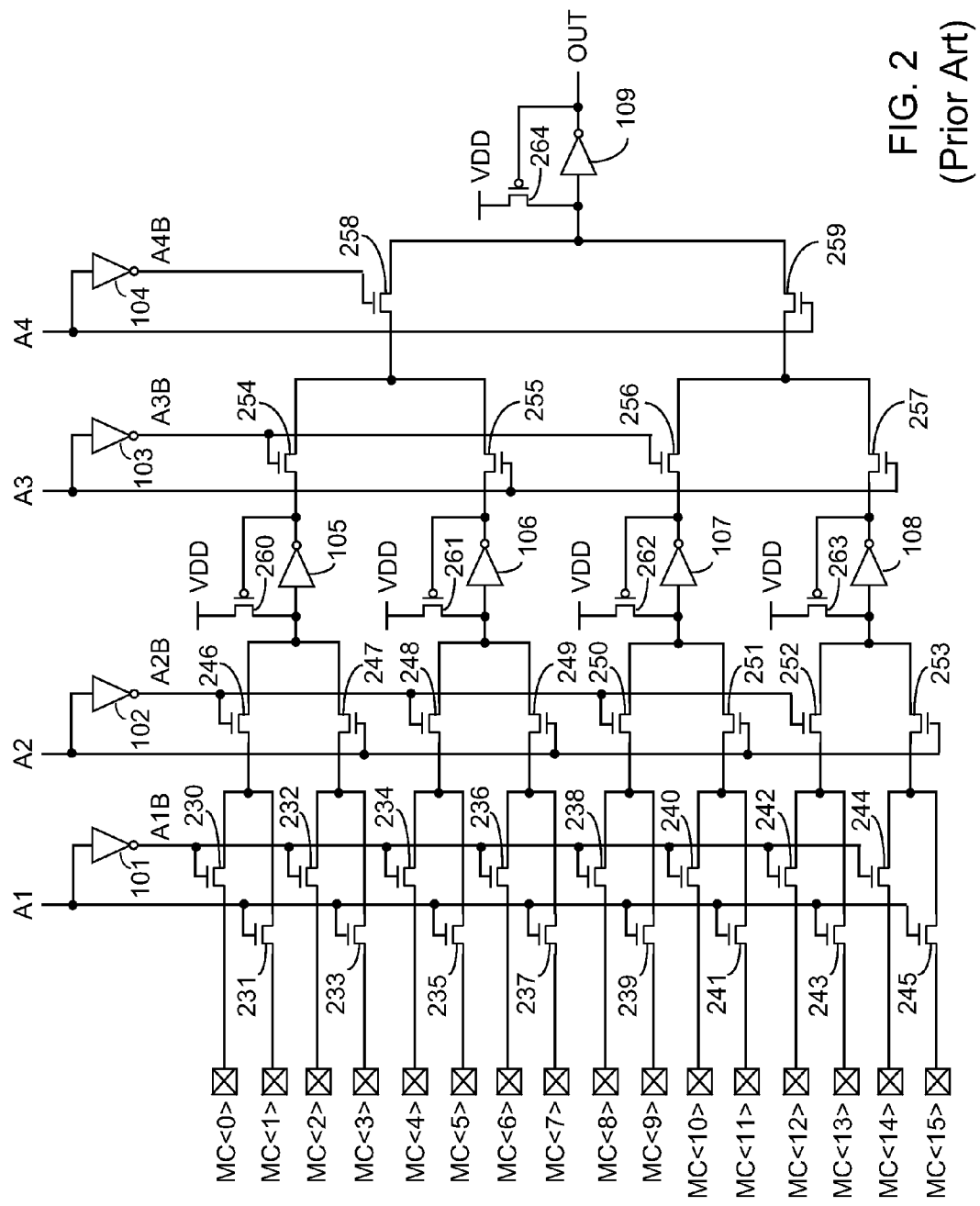
FIG. 2 shows a second known 4-input LUT.
Figure 3:
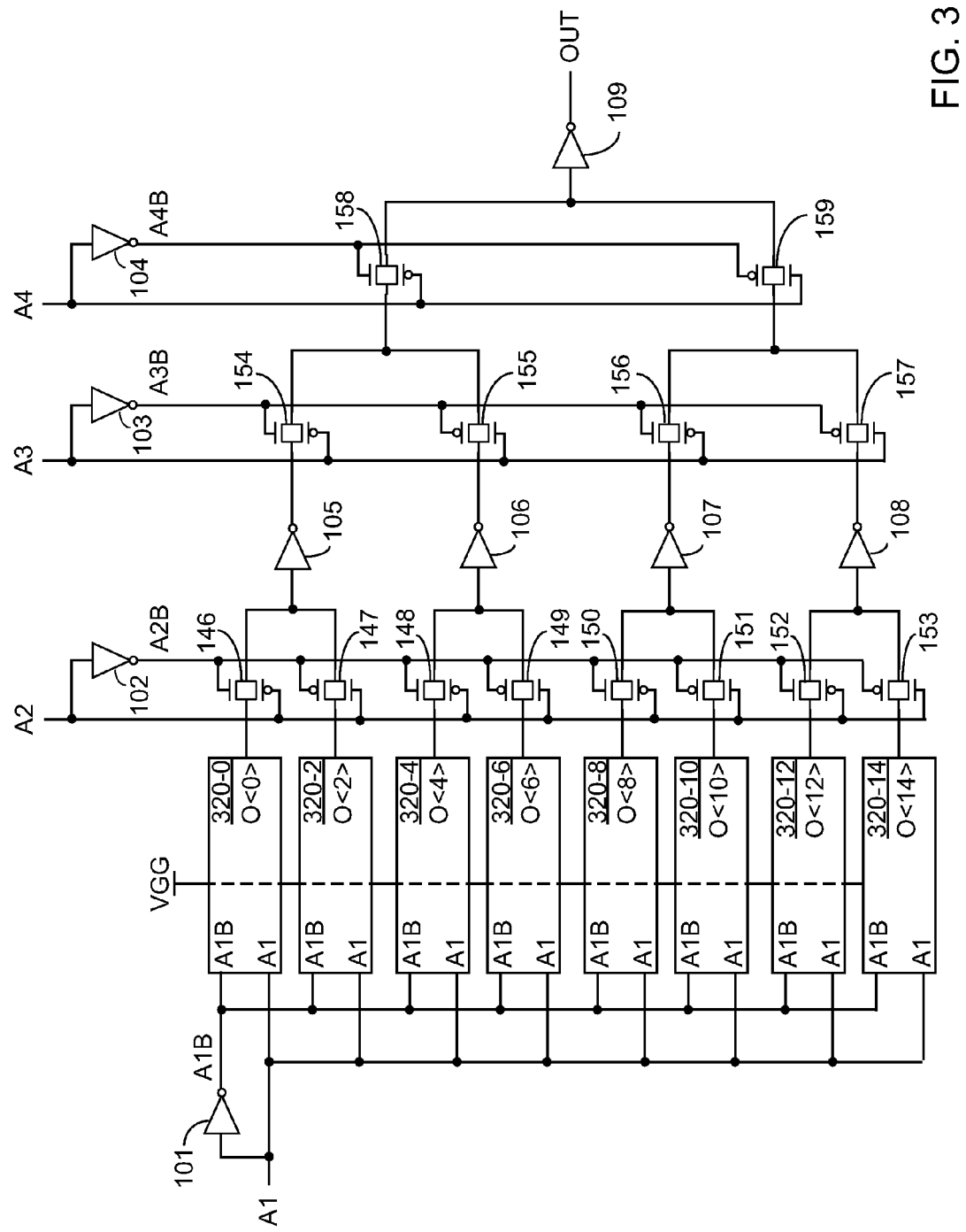
FIG. 3 shows a first exemplary LUT structure having a differentiated first stage, according to one embodiment of the present invention.

FIG. 3 illustrates a 4-input LUT implemented with a differentiated first stage, according to one embodiment. FIG. 4 illustrates an exemplary multiplexing circuit that can be used in the first stage of the 4-input LUT of FIG. 3. The first stage of the LUT is a circuit designed to perform a multiplexing function while optimizing the speed of a path from the LUT input to the data outputs. Therefore, for each output of the first stage, a delay from the LUT input to the output is less than a delay from any of the associated memory cells to the output. On the contrary, in a typical multiplexer, such as those used to implement the second, third, and fourth stages of the LUT shown in FIG. 3, the fastest paths are the paths from the data inputs to the data output of the multiplexer. Thus, the LUT illustrated in FIGS. 3-4 has more balanced through-delays, from the various LUT inputs to the output, than the typical LUTs shown in FIGS. 1-2. Note that the circuit of FIG. 3 will not have completely balanced through-delays, e.g., the through-delays from the various LUT inputs to the outputs will not all be the same. However, the variations among the delays will be less than in a similarly-sized LUT implemented as shown in FIG. 1 or FIG. 2.

Figure 1:
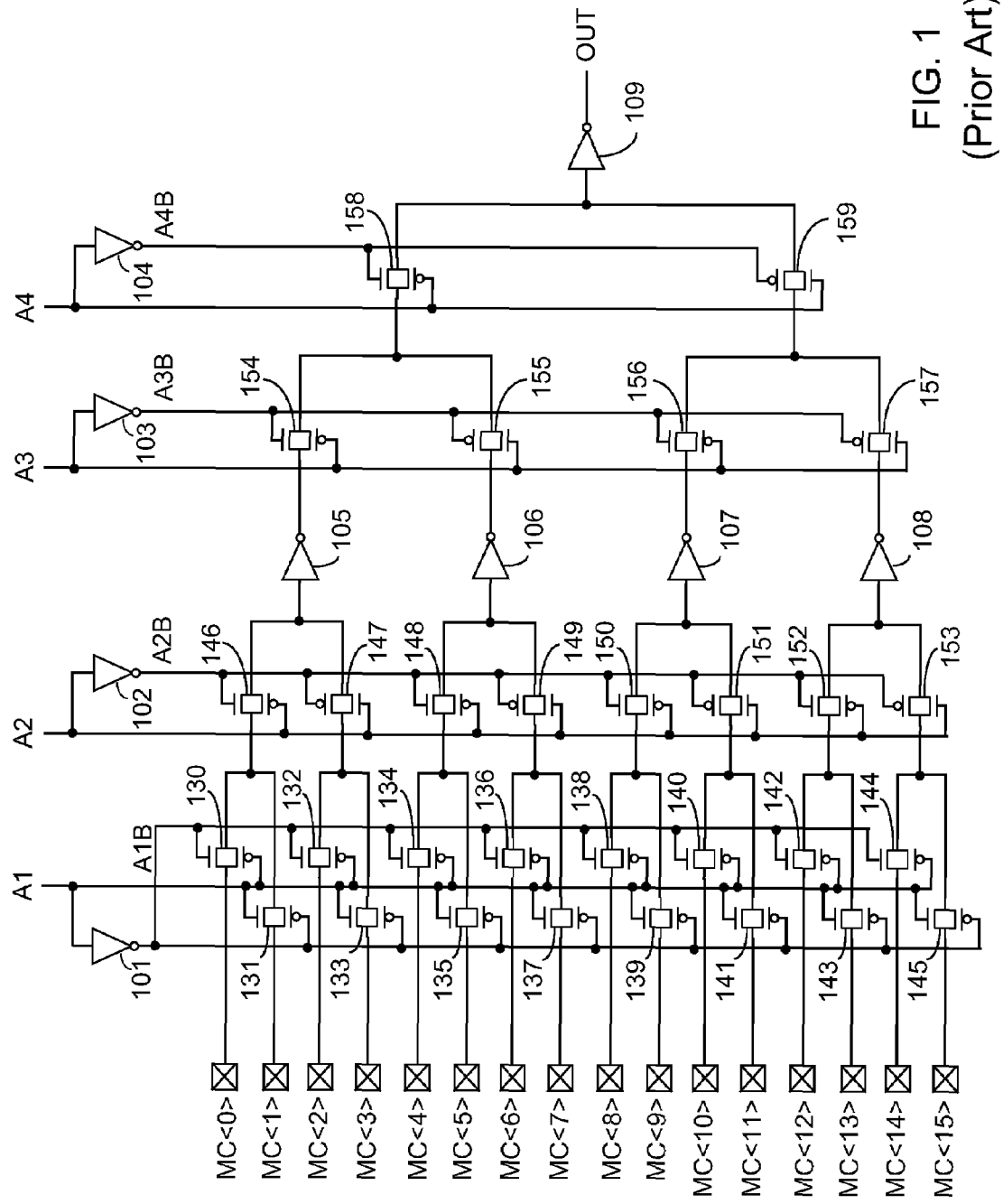
FIG. 1 shows a first known 4-input lookup table (LUT).

As shown in FIGS. 1 and 2, each stage of an n-input LUT is typically controlled by one LUT input signal. In FIGS. 1 and 2, the first stage includes eight 2-to-1 multiplexers with data inputs coming from memory cells, and a control input coming from a first LUT input A1. In the embodiment of FIGS. 3-4, the first stage includes eight multiplexing circuits 320-0 through 320-14, with data inputs coming from a first LUT input A1, and control inputs coming from memory cells (MC<i> and MC<i+1> in FIG. 4). Thus, the first stage reacts quickly to changes in the LUT input signal A1, reducing the delay through the first stage. Because the A1 LUT input has the largest delay through a typical LUT, such as those shown in FIGS. 1 and 2, the overall through-delay for the LUT is typically determined by the delay from the A1 LUT input to the LUT output OUT. Thus, speeding up the first stage can reduce the overall through-delay of the LUT.

The 4-input LUT of FIG. 3 includes first, second, third, and fourth stages. The first stage includes eight multiplexing circuits 320-0 through 320-14 with data inputs A1 and A1B (A1 inverted by inverter 101) and outputs O<0> through O<14>, respectively. The second, third, and fourth stages of the pictured embodiment are the same as in the LUT of FIG. 1, so are not again described.

As previously described, for each output of the first stage, a delay from the LUT input to the output is less than a delay from any of the associated memory cells to the output. This attribute assists with balancing the through-delays for the LUT, from the LUT inputs to the output. One multiplexing circuit having this attribute is shown in FIG. 4. In the embodiment of FIG. 4, each multiplexing circuit 320-i includes four N-channel pass transistors 401-404, a pulldown 405, a pullup 406, memory cells MC<i> and MC<i+1>, and inverters 407-408, coupled together as shown in FIG. 4. (In some embodiments, inverters 407-408 are included in the associated memory cells, rather than being implemented externally to the memory cells.) Pass transistors 402 and 404 are coupled in series between data input A1 and output O<i>, with pullup 406 coupled between the two pass transistors. Pass transistors 401 and 403 are coupled in series between data input A1B and the output O<i>, with pulldown 405 coupled between the pass transistors. Transistors 402 and 405 are gated by the inverted output QB<i> of memory cell MC<i> (inverted by inverter 407). Transistors 401 and 406 are gated by the true output Q<i> of memory cell MC<i>. Transistor 403 is gated by the inverted output QB<i+1> of memory cell MC<i+1> (inverted by inverter 408). Transistor 404 is gated by the true output Q<i+1> of memory cell MC<i+1>.

Note that multiplexing circuit 320-i replaces the 2-to-1 multiplexer that is typically used in the first stage of a LUT. FIGS. 5 and 6 show such typical 2-to-1 multiplexers. FIG. 5 shows a 2-to-1 multiplexer from the first stage of the LUT of FIG. 1, which uses CMOS pass gates 501, 502 as pass transistors. FIG. 6 shows a 2-to-1 multiplexer from the first stage of the LUT of FIG. 2, which uses N-channel pass transistors 601, 602 with pullups to VDD after every other stage (see FIG. 2 for pullups). Each of these 2-to-1 multiplexers has memory cells at the data inputs and is controlled by the LUT input A1. In contrast, as previously described, the multiplexing circuit of FIG. 4 has the LUT input A1 as the data input (with the inverted LUT input A1B), and is controlled by values stored in the memory cells.

Returning now to FIG. 4, the pullup 406 and the pulldown 405 provide an additional capability beyond that of a typical multiplexer, by providing a means for applying a power high value or a ground value to the output O<i>. In the 2-to-1 multiplexers of FIGS. 5 and 6, this capability is also available, being supplied by the memory cells on the data inputs of the multiplexers. Therefore, each of the structures of FIGS. 4-6 has the same truth table, which is illustrated in FIG. 7. In each case, the four available output values are: the LUT input A1, the inverse A1B of the LUT input A1, power high (logic "1"), and ground (logic "0").

In the pictured embodiments, the first stage is optimized for high speed by operating the transistors in the first stage at a higher voltage than the other stages of the LUT. In the pictured embodiments, the circuitry in the first stage is coupled to receive a voltage high VGG value higher than the standard voltage high VDD value utilized by the other stages. For example, in one embodiment the VDD value is 1.0 volts, and the VGG value is 1.5 volts. To accommodate this higher voltage, a thicker oxide is used on the transistors, as shown by the triangle included in the transistors in FIG. 4 (see transistors 401-406). All circuitry driving the gates of these thicker-oxide transistors (memory cells MC<i>, MC<i+1> and inverters 407-408) is also coupled to receive power high VGG, and is also composed of thicker-oxide transistors. However, in other embodiments (not shown), the same oxide thickness is used for all transistors. In some embodiments, pass transistors having lower threshold voltages are used in the input-to-output data path to reduce the through-delay of the first stage.

The structure shown in FIGS. 3-4 has other advantages in addition to reducing the overall through-delay of the LUT. For example, the thicker oxide reduces leakage current. A thicker oxide makes a transistor slower when used to implement inverters, for example, because the gate-to-drain current is reduced. However, the source-to-drain current is not reduced, so using the thicker oxide on pass transistors controlled by memory cells does not adversely impact the performance of the pass transistors. Thus, the leakage current is reduced without reducing the speed of the pass transistors. Instead, as previously noted, the higher gate voltage (VGG instead of VDD) improves the operating speed of the first stage.

Figure 8:
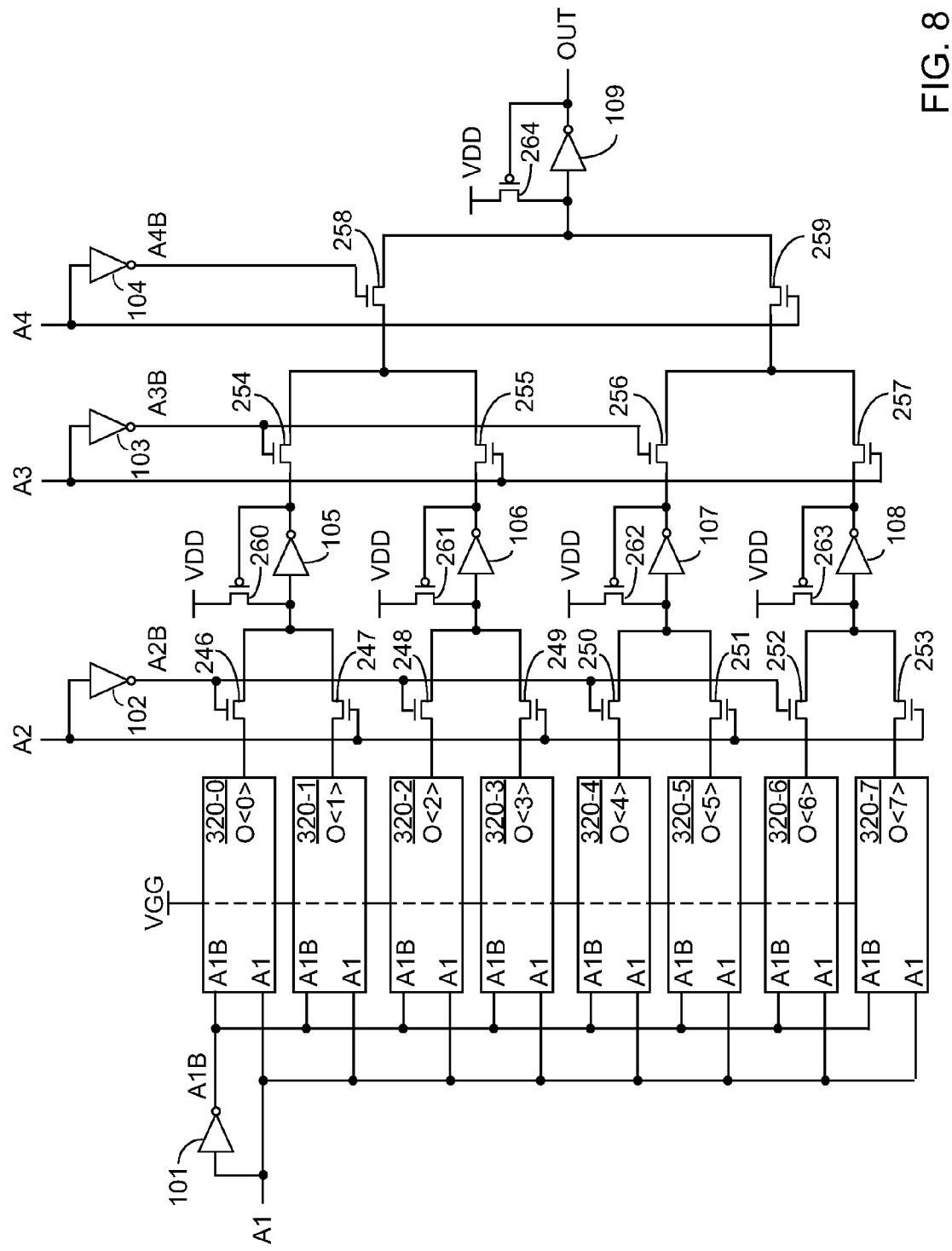
FIG. 8 shows a second exemplary LUT structure having a differentiated first stage, according to another embodiment of the present invention.

FIG. 8 illustrates a variation on the LUT circuit of FIG. 3 in which the second, third, and fourth stages are implemented using N-channel pass transistors instead of CMOS pass gates. The first stage is implemented in the same fashion as in the LUT circuit of FIG. 3. The second, third, and fourth stages are implemented in the same fashion as in the LUT circuit of FIG. 2.

Figure 9:
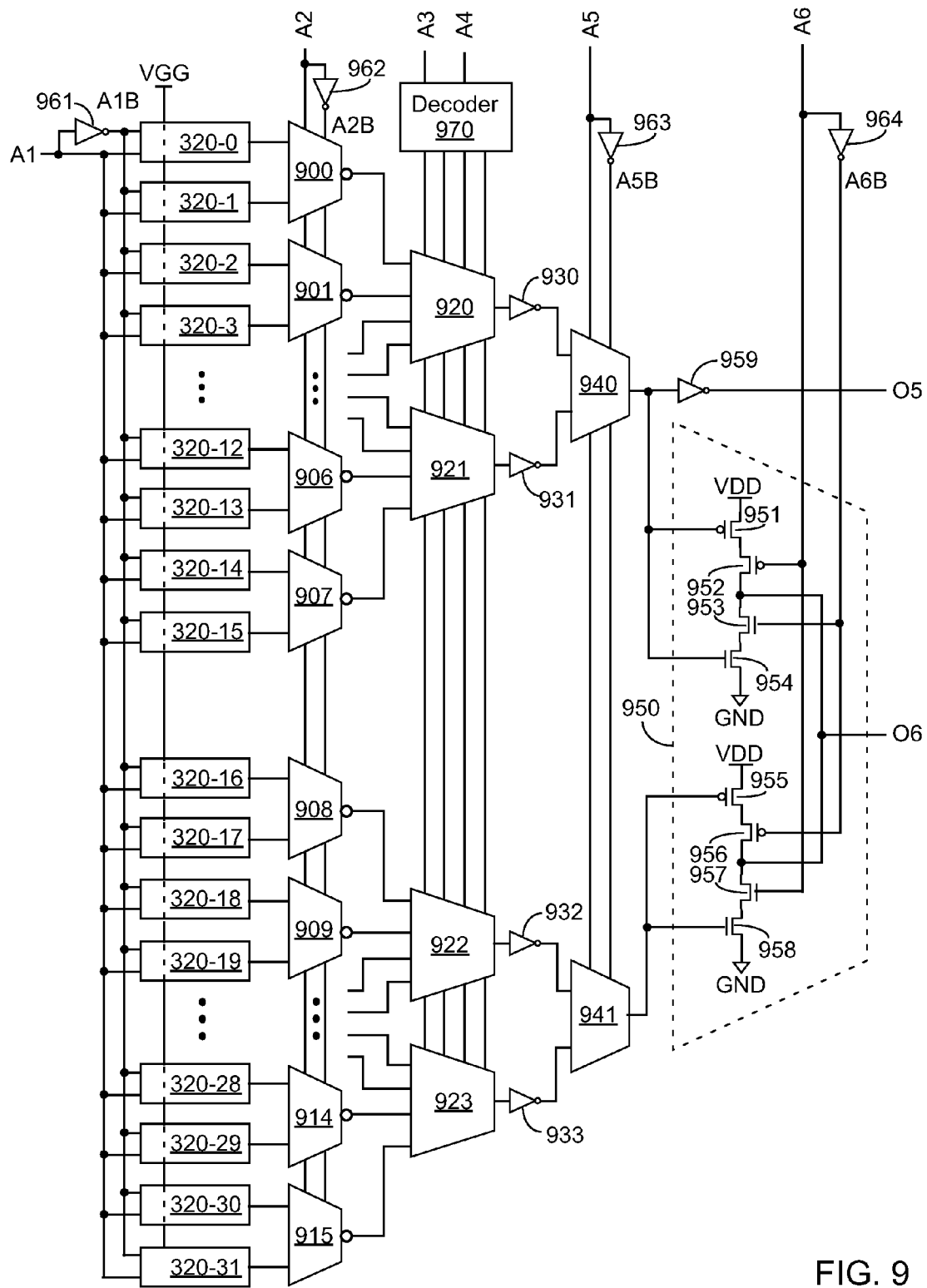
FIG. 9 shows a third exemplary LUT structure having a differentiated first stage, according to yet another embodiment of the present invention.

FIG. 9 shows another embodiment, in which the through-delays for the LUT are further balanced by deliberately introducing delays on the LUT input paths for later stages of the LUT. In other words, the first stage is still optimized to minimize delays from the LUT input A1 to the outputs of the first stage, at the expense of a greater delay from any of the associated memory cells to the outputs. However, the input paths from the third and fourth LUT inputs (A3 and A4 in the pictured embodiment) include a delay element that further slows these inputs, creating a more balanced delay. In other embodiments (not shown), a similar delay element is introduced for the fifth and sixth LUT inputs (A5 and A6 in the pictured embodiment). This additional delay element is omitted in the pictured embodiment, to allow the output of the next-to-last stage to be provided as an optional second output of the LUT.

In some embodiments the delay element is a simple delay, such as a longer wire between the interconnect structure of the integrated circuit and the control input of the multiplexer circuit, or a slower input multiplexer driving the control input. However, in the pictured embodiment the delay element is a decoder circuit, which serves another purpose in addition to delaying the third and fourth LUT inputs. The decoder circuit permits the delays from the data inputs to the data outputs of the stage to be reduced, compared to similar circuit without the delay element. This feature is explained below in conjunction with FIG. 10.

The LUT of FIG. 9 is a 6-input LUT having five stages. The first stage includes 32 copies 320-0 through 320-31 of the multiplexing circuit shown in FIG. 4. Therefore, the first stage includes 64 memory cells. Each stage is powered by a voltage high VGG value higher than the standard voltage high VDD value utilized by the other stages. Each of the multiplexing circuits 320-0 through 320-31 has two data inputs driven by the first LUT input A1 and its complement A1B, inverted by inverter 961, and one output.

The outputs of the first stage drive the second stage, which is implemented in this embodiment as fifteen standard 2-to-1 multiplexers 900-915, each with an inverting output. Each of multiplexers 900-915 can be implemented, for example, with N-channel transistors, an inverter, and a P-channel pullup, as shown in FIG. 8, or as CMOS passgates with an inverter as shown in FIG. 3. The second stage is controlled by the second LUT input, A2, and its complement A2B, inverted by inverter 962, and has 16 outputs.

The third stage has two LUT inputs, and could be implemented as two more stages similar to the second stage. However, in the pictured embodiment the two LUT inputs A3 and A4 are combined using a decoder 970, which is used to control four 4-to-1 multiplexers 920-923. By combining the circuitry for these two LUT inputs, a pass transistor can be removed from the paths from the data inputs to the data outputs of this stage. For example, FIG. 10 shows one implementation of decoder 970 and how the addition of this decoder reduces the through-delay for the stage.

Figure 10:
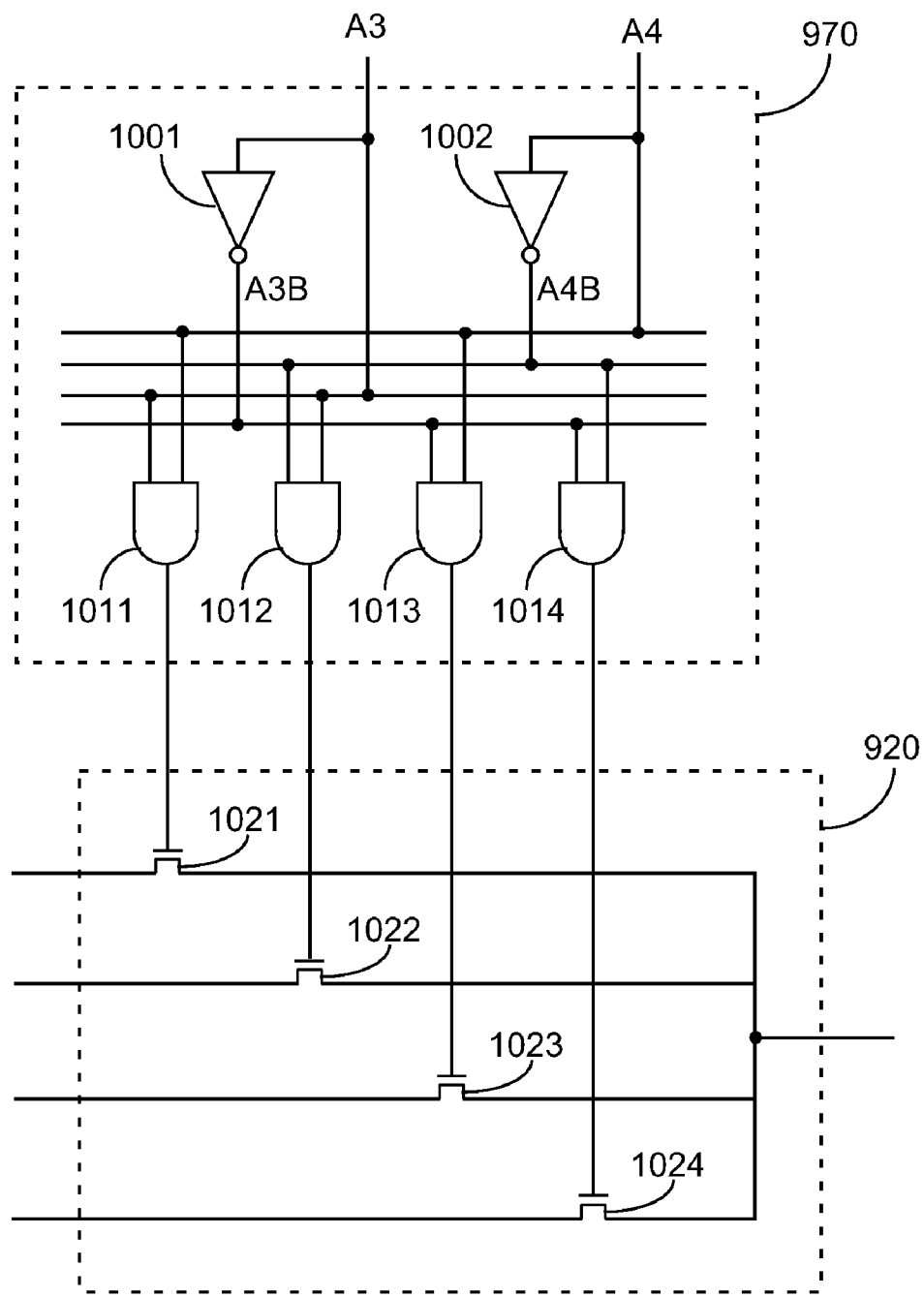
FIG. 10 shows a decoder circuit and how it can be used to further balance delays in the embodiment of FIG. 9.

The pictured implementation of decoder 970 includes four logical AND-gates 1011-1014 and two inverters 1001-1002, coupled together as shown in FIG. 10. The two input signals have four different possible combinations of values (00, 01, 10, and 11), and each of these combinations causes a different one of the decoder outputs to go high. Only one of the decoder outputs is high at any given time. Each of the outputs drives one of the transistors 1021-1024 of each of the 4-input multiplexers 920-923 of FIG. 9. Thus, the path through this stage from data in to data out traverses only one transistor instead of two, although the path is controlled by two control signals A3 and A4. Note that transistors 1021-1024 can be N-channel transistors or CMOS passgates, as with the pass transistors of the previous stages.

Returning now to FIG. 9, the outputs of the third stage are inverted by inverters 930-933 and passed to the fourth stage. In some embodiments, the fourth and fifth stages, controlled by LUT inputs A5 and A6, respectively, are combined as in the third stage. However, in the pictured embodiment the fourth and fifth stages are separately implemented, as shown, to give the pictured LUT an optional second output O5 from the fourth stage, in addition to the output O6 of the fifth stage.

Thus, the fourth stage is implemented in this embodiment as two standard 2-to-1 multiplexers 940-941. Each of multiplexers 940-941 can be implemented, for example, with N-channel transistors, as shown in FIG. 8, or as CMOS passgates as shown in FIG. 3. The fourth stage is controlled by the fifth LUT input, A5, and its complement A5B, inverted by inverter 963, and has two outputs.

The output of multiplexer 940 is inverted by inverter 959 and provides output signal O5. Thus, output signal O5 can provide any function of up to five input signals, A1-A5. Inverters can be inserted wherever desired in the multiplexer structure, with an additional inversion being nullified by simply storing inverted data in the configuration memory cells included in multiplexing circuits 320-0 through 320-31 (see FIG. 4).

Multiplexers 940 and 941 both drive data input terminals of multiplexer 950, which is controlled by input signal A6 and its complement A6B (provided by inverter 964) to select either of the two signals from multiplexers 940-941 to drive output terminal O6. Thus, output signal O6 can either provide any function of up to five input signals A1-A5 (when multiplexer 950 selects the output of multiplexer 941, i.e., when signal A6 is high), or any function of up to six input signals A1-A6.

In the pictured embodiment, multiplexer 950 is implemented as two three-state buffers, where one buffer is driving and the other buffer is disabled at all times. The first buffer includes transistors 951-954, and the second buffer includes transistors 955-958, coupled together as shown in FIG. 9.

The through-delays of the various LUT embodiments shown herein can be further balanced for the various LUT inputs (e.g., A1-A6 in FIG. 9) by speeding up the first stage in other ways. For example, the embodiment of FIG. 9 shows a first stage that uses a higher gate voltage than the subsequent stages. The first stage can also be increased in speed relative to the subsequent stages by, for example, using larger gate widths for the pass transistors in the first stage than in subsequent stages. Additionally or alternatively, the pass transistors in the first stage can be designed with a lower threshold voltage than the pass transistors in the subsequent stages.

It will be clear to those of skill in the art that different types of pass gates can be used with the exemplary differentiated first stage shown herein to implement various types and sizes of selection circuits. Further, it will be clear to those of skill in the art that the number of inputs to the selection circuit need not be four or six, but can be two, three, five, seven, or a greater number, depending on the number and implementation of the multiplexer circuit that includes the stages following the first stage. It will be apparent to one skilled in the art after reading this specification that the present invention can be practiced within these and other architectural variations.

Further, multiplexing circuits, multiplexers, decoders, delay elements, pullups, pulldowns, inverters, transistors, pass transistors, N-channel transistors, P-channel transistors, CMOS pass gates, memory cells, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known. For example, a P-channel transistor can be used to implement the pullup in FIG. 4 by using the inverted memory cell output to gate the pullup, and so forth.

Moreover, some components are shown directly connected to one another while others are shown connected via intermediate components. In each instance, the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A lookup table (LUT) in an integrated circuit, the LUT comprising:

a first stage comprising a first plurality of memory cells and a second plurality of outputs, wherein the second plurality is less than the first plurality, the first stage being coupled to receive a first LUT input;

wherein each of the outputs of the first stage is associated with at least one of the memory cells, and, for each output, a delay from the first LUT input to the output is less than a delay from the at least one associated memory cell to the output; and a multiplexer circuit comprising a plurality of data inputs coupled to the outputs of the first stage, a data output coupled to an output terminal of the LUT, and first and second control inputs coupled to receive second and third LUT inputs, respectively.

2. The LUT of claim 1, further comprising:

a delay element coupled between second and third LUT input terminals respectively coupled to provide the second and third LUT inputs and the first and second control inputs of the multiplexer circuit.

3. The LUT of claim 2, wherein the delay element increases delays between the second and third LUT input terminals and the data output of the multiplexer circuit and enables reduced delays between the data inputs of the multiplexer circuit and the data output of the multiplexer circuit, compared to a similar circuit without the delay element.

4. The LUT of claim 3, wherein the delay element comprises a decoder that inputs the second and third LUT inputs and outputs more than two signals to the multiplexer circuit.

5. The LUT of claim 1, wherein the first stage comprises first transistors and the multiplexer circuit comprises second transistors, and wherein the first transistors are faster than the second transistors.

6. The LUT of claim 5, wherein the first transistors are larger than corresponding ones of the second transistors.

7. The LUT of claim 5, wherein the first transistors have a thicker oxide than corresponding ones of the second transistors.

8. The LUT of claim 5, wherein the first transistors operate at a higher voltage than corresponding ones of the second transistors.

9. The LUT of claim 5, wherein the first transistors have lower threshold voltages than corresponding ones of the second transistors.

10. The LUT of claim 1, wherein the first stage comprises a plurality of multiplexing circuits each having a first data input coupled to receive the first LUT input, a second data input coupled to receive a complement of the first LUT input, and first and second control inputs coupled to respective first and second ones of the memory cells.

11. A lookup table (LUT) in an integrated circuit, the LUT comprising:

a first stage comprising a first plurality of memory cells and a second plurality of outputs, wherein the second plurality is less than the first plurality, the first stage being coupled to receive a first LUT input;

wherein each of the outputs of the first stage is associated with at least one of the memory cells, and, for each output, a delay from the first LUT input to the output is less than a delay from the at least one associated memory cell to the output;

a second stage comprising a first multiplexer circuit having a plurality of data inputs coupled to the outputs of the first stage, a plurality of data outputs, and a control input coupled to receive a second LUT input;

wherein each of the outputs of the second stage is associated with at least one data input of the second stage, and, for each output, a delay from each associated data input to the output is less than a delay from the second LUT input to the output; and a second multiplexer circuit comprising a plurality of data inputs coupled to the outputs of the second stage, a data output coupled to an output terminal of the LUT, and first and second control inputs coupled to receive third and fourth LUT inputs, respectively.

12. The LUT of claim 11, further comprising:

a delay element coupled between third and fourth LUT input terminals respectively coupled to provide the third and fourth LUT inputs and the first and second control inputs of the second multiplexer circuit.

13. The LUT of claim 12, wherein the delay element increases delays between the third and fourth LUT input terminals and the data output of the second multiplexer circuit and enables reduced delays between the data inputs of the second multiplexer circuit and the data output of the second multiplexer circuit, compared to a similar circuit without the delay element.

14. The LUT of claim 13, wherein the delay element comprises a decoder that inputs the third and fourth LUT inputs and outputs more than two signals to the multiplexer circuit.

15. The LUT of claim 11, wherein the first stage comprises first transistors and the multiplexer circuit comprises second transistors, and wherein the first transistors are faster than the second transistors.

16. The LUT of claim 15, wherein at least one of the following statements is true:

the first transistors are larger than corresponding ones of the second transistors;

the first transistors have a thicker oxide than corresponding ones of the second transistors;

the first transistors operate at a higher voltage than corresponding ones of the second transistors;

the first transistors have lower threshold voltages than corresponding ones of the second transistors.

17. The LUT of claim 11, wherein the first stage comprises a plurality of multiplexing circuits each having a first data input coupled to receive the first LUT input, a second data input coupled to receive a complement of the first LUT input, and first and second control inputs coupled to respective first and second ones of the memory cells.

18. An integrated circuit, comprising:

a lookup table, comprising:

a first stage comprising a first plurality of memory cells and a second plurality of outputs, wherein the second plurality is less than the first plurality, the first stage being coupled to receive a first LUT input; and a multiplexer circuit comprising a plurality of data inputs coupled to the outputs of the first stage, a data output coupled to an output terminal of the LUT, and first and second control inputs coupled to receive second and third LUT inputs, respectively, wherein each of the outputs of the first stage is associated with at least one of the memory cells, and, for each output, a delay from the first LUT input to the output is less than a delay from the at least one associated memory cell to the output.

19. The integrated circuit of claim 18, further comprising:

a delay element coupled between second and third LUT input terminals respectively coupled to provide the second and third LUT inputs and the first and second control inputs of the multiplexer circuit.

20. The integrated circuit of claim 19, wherein the first stage comprises first transistors and the multiplexer circuit comprises second transistors, and wherein the first transistors are faster than the second transistors.

* * * * *